(12) United States Patent
Onogi

(10) Patent No.: US 9,178,033 B2
(45) Date of Patent: Nov. 3, 2015

(54) MANUFACTURING METHOD OF SEMICONDUCTOR DEVICE

(71) Applicant: Atsushi Onogi, Toyota (JP)

(72) Inventor: Atsushi Onogi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 14/201,096

(22) Filed: Mar. 7, 2014

(65) Prior Publication Data

US 2014/0295633 A1 Oct. 2, 2014

(30) Foreign Application Priority Data

Mar. 26, 2013 (JP) ................. 2013-063793

(51) Int. Cl.
*H01L 29/66* (2006.01)
*H01L 21/04* (2006.01)
*H01L 29/16* (2006.01)
*H01L 21/3065* (2006.01)

(52) U.S. Cl.
CPC ........ *H01L 29/66068* (2013.01); *H01L 21/046* (2013.01); *H01L 21/3065* (2013.01); *H01L 29/1608* (2013.01)

(58) Field of Classification Search
CPC .................................... H01L 21/046
USPC .......................... 438/270; 257/331
See application file for complete search history.

(56) References Cited

U.S. PATENT DOCUMENTS

| | | | | |
|---|---|---|---|---|
| 7,470,953 B2* | 12/2008 | Takaya et al. | ................. | 257/330 |
| 7,999,312 B2* | 8/2011 | Takaya et al. | ................. | 257/331 |
| 8,575,689 B2* | 11/2013 | Mimura et al. | ................ | 257/330 |
| 8,598,652 B2* | 12/2013 | Takaya | ........................... | 257/331 |
| 2006/0289928 A1* | 12/2006 | Takaya et al. | ................. | 257/330 |
| 2009/0166730 A1 | 7/2009 | Okuno et al. | | |
| 2010/0276729 A1* | 11/2010 | Aoi et al. | ....................... | 257/139 |
| 2012/0187478 A1* | 7/2012 | Takaya | ........................... | 257/331 |

FOREIGN PATENT DOCUMENTS

| | | |
|---|---|---|
| JP | A-2002-359378 | 12/2002 |
| JP | A-2005-116822 | 4/2005 |
| JP | 2008-294210 A | 12/2008 |
| JP | 2009-158681 A | 7/2009 |

OTHER PUBLICATIONS

Craigie, C. J. D., et al. "Polymer thickness effects on Bosch etch profiles." Journal of Vacuum Science & Technology B: Microelectronics and Nanometer Structures 20.6 (2002): 2229-2232.*

* cited by examiner

*Primary Examiner* — Chi-Hua Yang
(74) *Attorney, Agent, or Firm* — Oliff PLC

(57) ABSTRACT

A manufacturing method of a semiconductor device includes: a semiconductor substrate including a drain, a drift making contact with a front face of the drain, a body contacting with a front face of the drift, a source provided in part of a front face of the body, and a floating surrounded by the drift; and a gate including an insulator formed on an inner wall of a trench and a electrode disposed inside the insulator and which has a bottom portion contacting with the floating, the manufacturing method includes: forming the trench in a semiconductor wafer so as to have a bottom portion in which an end portion in a short direction perpendicular to a longitudinal direction thereof is deeper than a central portion; injecting an impurity ions into the bottom portion of the trench; and forming the central portion of the trench in the short direction to be deepened.

2 Claims, 8 Drawing Sheets

MANUFACTURING METHOD OF SEMICONDUCTOR DEVICE

INCORPORATION BY REFERENCE

The disclosure of Japanese Patent Application No. 2013-063793 filed on Mar. 26, 2013 including the specification, drawings and abstract is incorporated herein by reference in its entirety.

BACKGROUND OF THE INVENTION

1. Field of the Invention

The present invention relates to a manufacturing method of a semiconductor device.

2. Description of Related Art

Japanese Patent Application Publication No. 2002-359378 (JP 2002-359378 A) describes a method for manufacturing a MOSFET including a floating p-layer around a bottom portion of a trench, by use of a semiconductor substrate made from silicon carbide. In a case where the semiconductor substrate made from silicon carbide is used, impurity is hard to diffuse in the semiconductor substrate, in comparison with a case where a semiconductor substrate made from silicon is used. Particularly, in a case where impurity is hard to diffuse in a direction perpendicular to an injection direction of impurity ions in a semiconductor substrate and the impurity ions are injected into a bottom portion of a trench to form a floating layer, the impurity ions thus injected are hard to diffuse in a plane direction of the semiconductor substrate. As a result, when a width of the floating layer in a short direction of a trench gate (a direction perpendicular to a longitudinal direction of the trench gate) is insufficient, a withstand voltage of a semiconductor device decreases. In the manufacturing method of JP 2002-359378 A, in a step of forming the floating p-layer, boron ions that are relatively easy to diffuse are injected in a deeper position of the semiconductor substrate, and aluminum ions that are relatively hard to diffuse are injected in a shallower position. Hereby, the width of the floating p-layer in a horizontal direction is widened in a deep position of the semiconductor substrate, but is narrowed in a shallow position.

SUMMARY OF THE INVENTION

According to the technique of JP 2002-359378 A, by injecting the boron ions, the floating p-layer expands in directions other than the direction perpendicular to the injection direction of the impurity ions. The present invention provides a manufacturing method of a semiconductor device which method is able to diffuse impurity particularly in a direction perpendicular to an injection direction of impurity ions.

A first aspect of the present invention relates to a manufacturing method of a semiconductor device that includes: a semiconductor substrate made from silicon carbide and including a first conductivity type drain layer, a first conductivity type drift layer making contact with a front face of the drain layer, a second conductivity type body layer making contact with a front face of the drift layer, a first conductivity type source layer provided in part of a front face of the body layer, and a second conductivity type floating layer surrounded by the drift layer; and a trench gate which includes a gate insulating film formed on an inner wall of a trench and a gate electrode disposed inside the gate insulating film and which has a bottom portion making contact with the floating layer, and the manufacturing method includes: forming the trench in a semiconductor wafer so as to have a bottom portion in which an end portion in a short direction perpendicular to a longitudinal direction thereof is deeper than a central portion; injecting second conductivity type impurity ions into the bottom portion of the trench after forming the trench; and forming the central portion of the trench in the short direction to be deepened after injecting the second conductivity type impurity ions into the bottom portion of the trench.

According to the above aspect, it is possible to sufficiently widen a width of the floating layer in the short direction of the trench gate, thereby making it possible to manufacture a semiconductor device in which a withstand voltage characteristic is ensured.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
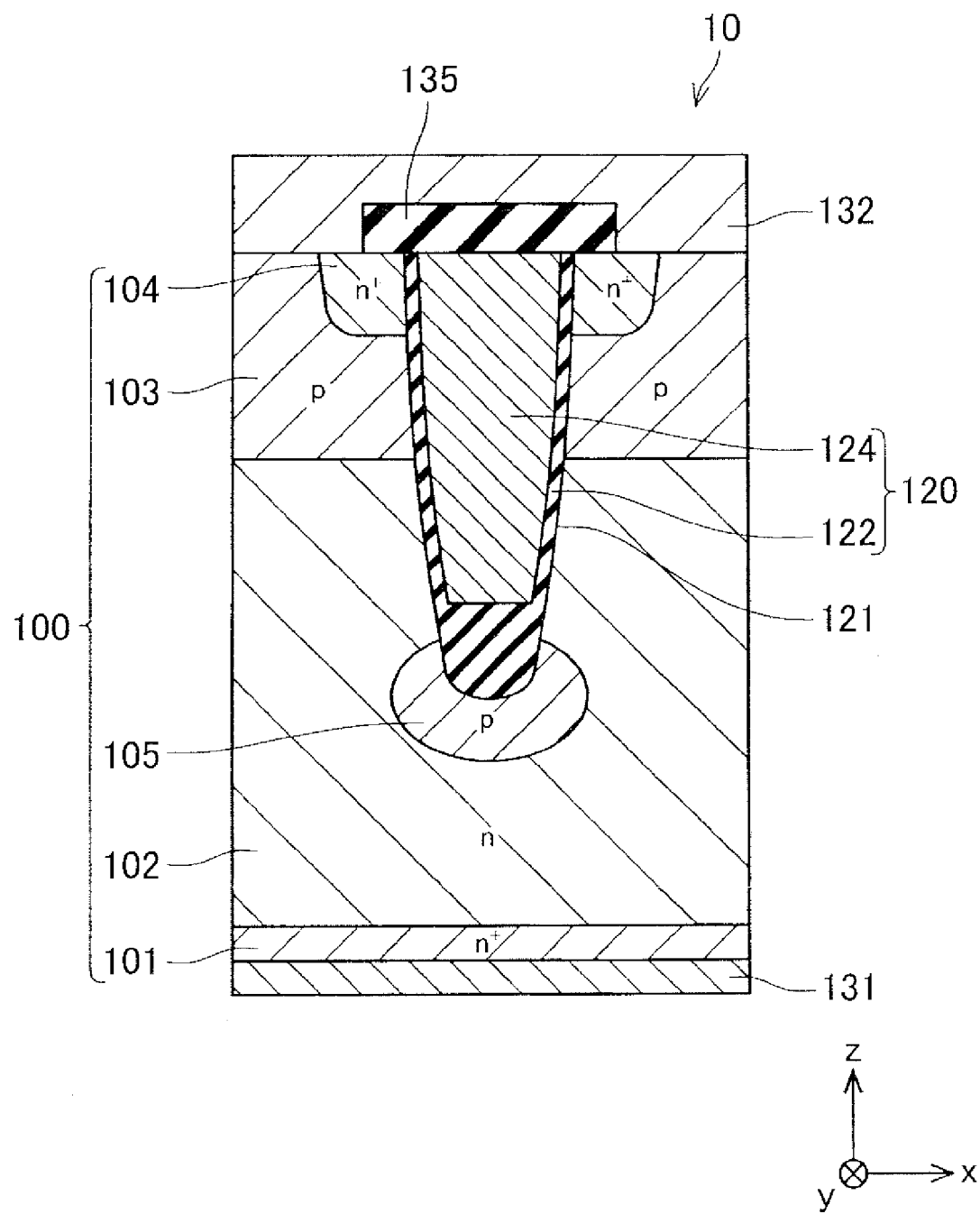
FIG. 1 is a drawing of a longitudinal section of a semiconductor device manufactured by a manufacturing method according to an embodiment of the present invention.

FIG. 1 illustrates a semiconductor device 10 manufactured by a manufacturing method according to an embodiment of the present invention. The semiconductor device 10 includes a semiconductor substrate 100 made from silicon carbide, a trench gate 120, an insulating film 135, a rear-face electrode 131 making contact with a rear face of the semiconductor substrate 100, and a front-face electrode 132 making contact with a front face of the semiconductor substrate 100. FIG. 1 illustrates part of a vertical MOSFET formed in an element region of the semiconductor device 10. A longitudinal direction of the trench gate 120 is a y direction. FIG. 1 only illustrates a section of one trench gate 120, but the semiconductor device 10 includes a plurality of trench gates 120 disposed at intervals in a short direction thereof (an x direction).

The semiconductor substrate 100 includes an $n^+$-type drain layer 101, an n-type drift layer 102 making contact with a front face of the drain layer 101, a p-type body layer 103 making contact with a front face of the drift layer 102, an $n^+$-source layer 104 provided in part of a front face of the body layer 103, and a p-floating layer 105 formed in the drift layer 102 and surrounded by the drift layer 102. The trench gate 120 extends in a negative direction of a z-axis from the front face of the semiconductor substrate 100. The trench gate 120 is formed to penetrate through the body layer 103 to a depth where the trench gate 120 reaches the drift layer 102. The trench gate 120 includes a gate insulating film 122 formed on an inner wall of a trench 121, and a gate electrode 123 disposed inside the gate insulating film 122. A bottom portion of the trench gate 120 makes contact with the floating layer 105. The floating layer 105 expands around the bottom portion of the trench gate 120 in the drift layer 102. The drain layer 101 is formed on the rear face of the semiconductor substrate 100, and makes contact with the rear-face electrode 131. Part of the body layer 103 and the source layer 104 are exposed out of the front face of the semiconductor substrate 100, and make contact with the front-face electrode 132. A front face of a gate electrode 124 is covered with the insulating film 135, so that the gate electrode 124 is insulated from the front-face electrode 132 via the insulating film 135.

A manufacturing method of the semiconductor device 10 according to the embodiment is described with reference to FIGS. 2 to 8.

Figure 2:
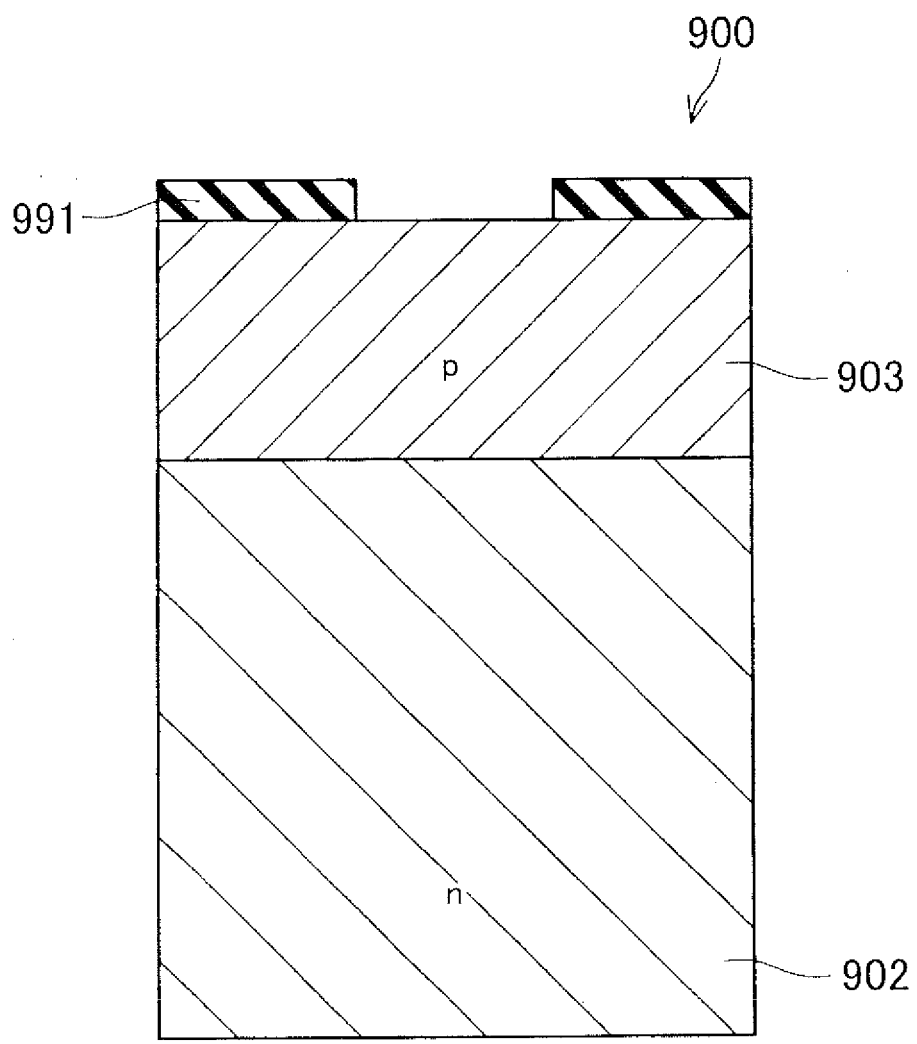
FIG. 2 is a view to describe the manufacturing method of the semiconductor device according to the embodiment of the present invention.

Initially, as illustrated in FIG. 2, a semiconductor wafer 900 which includes an n-layer 902 and a p-layer 903 laminated on a front face of the n-layer 902 and which is made from silicon carbide is prepared. The n-layer 902 is a layer to become the drift layer 102 illustrated in FIG. 1, and the p-layer 903 is a layer to become the body layer 103. On a front face of the semiconductor wafer 900, a mask 991 made from a silicon oxide film is formed. Note that the mask 991 has an opening in a portion where the trench 121 illustrated in FIG. 1 is to be formed. The mask 991 is formed such that the silicon oxide film is formed on an entire front face of the semiconductor wafer 900, and then that part of the silicon oxide film which corresponds to the opening is removed by dry etching.

(First Step)

Figure 3:
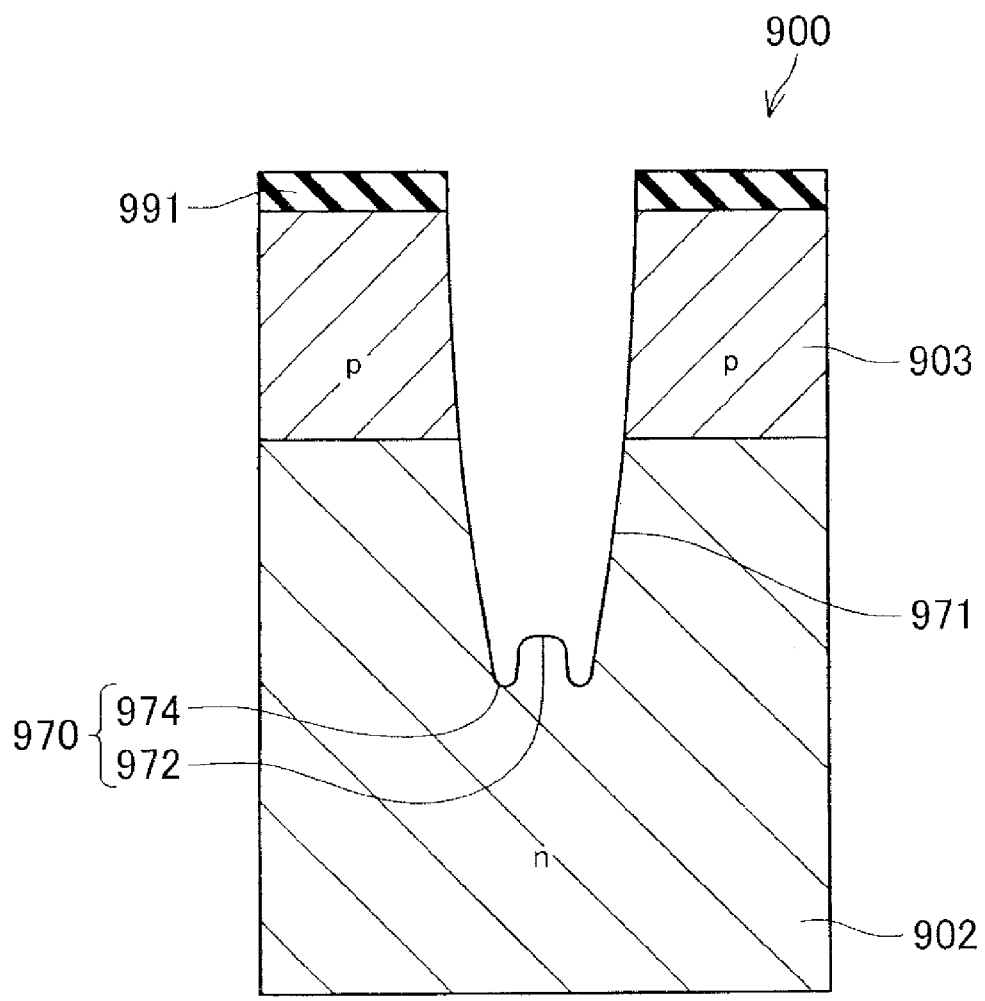
FIG. 3 is a view to describe the manufacturing method of the semiconductor device according to the embodiment of the present invention.

In a first step, a trench 971 having a bottom portion in which an end portion in its short direction is deeper than a central portion is formed in the semiconductor wafer 900. Dry etching is performed on the semiconductor wafer 900 illustrated in FIG. 2, so as to form the trench 971 as illustrated in FIG. 3. Gas containing a chlorine component may be used as process gas. Hereby, the trench 971 is formed as illustrated in FIG. 3. The bottom portion of the trench 971 includes a central portion 972 and an end portion 974 in the short direction (an x direction). The end portion 974 extends to that position of the semiconductor wafer 900 which is deeper than the central portion 972 (a position to become a negative direction in the z axis). The central portion 972 is generally flat, and the end portion 974 is inclined from its deepest portion toward the central portion 972.

An example of conditions for forming the trench 971 is as follows: mixed gas of $Cl_2/O_2/Ar=50/50/100$ is used as the process gas, a gas pressure is set to 30 mTorr to 200 mTorr, and an RF frequency is set to 380 kHz to 13.56 MHz.

(Second Step)

Figure 4:
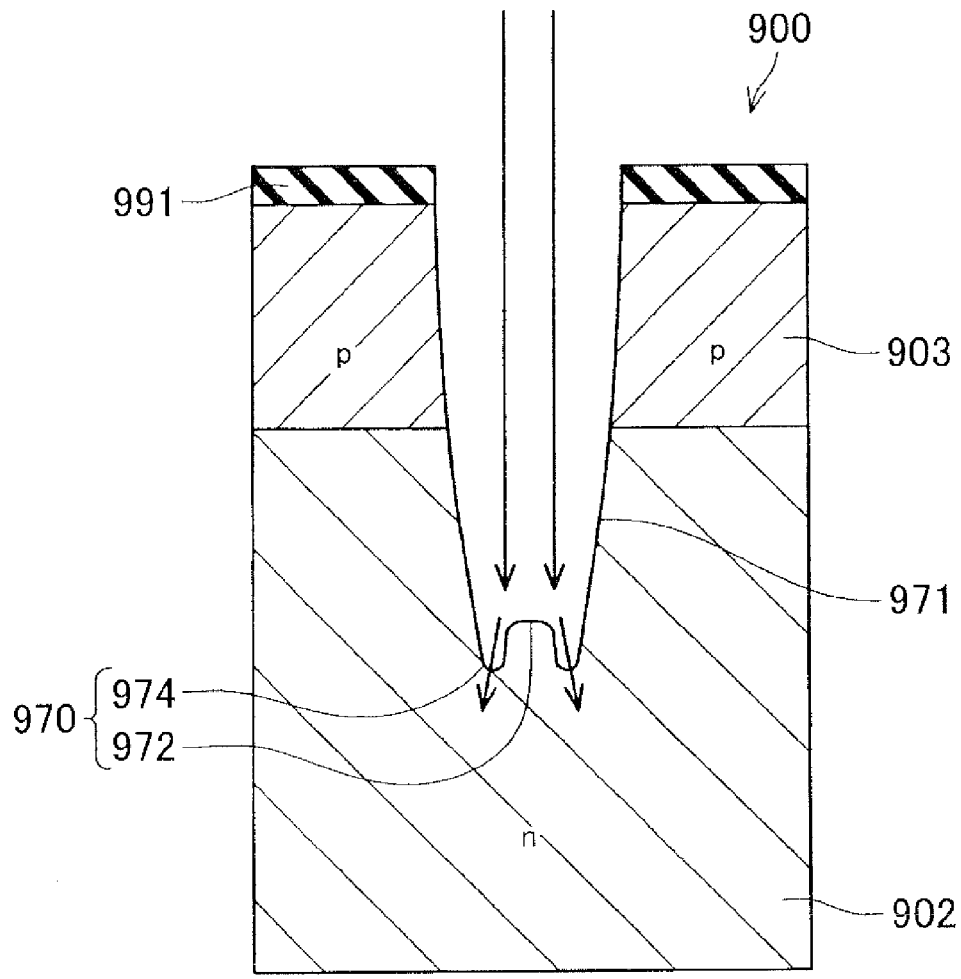
FIG. 4 is a view to describe the manufacturing method of the semiconductor device according to the embodiment of the present invention.
Figure 5:
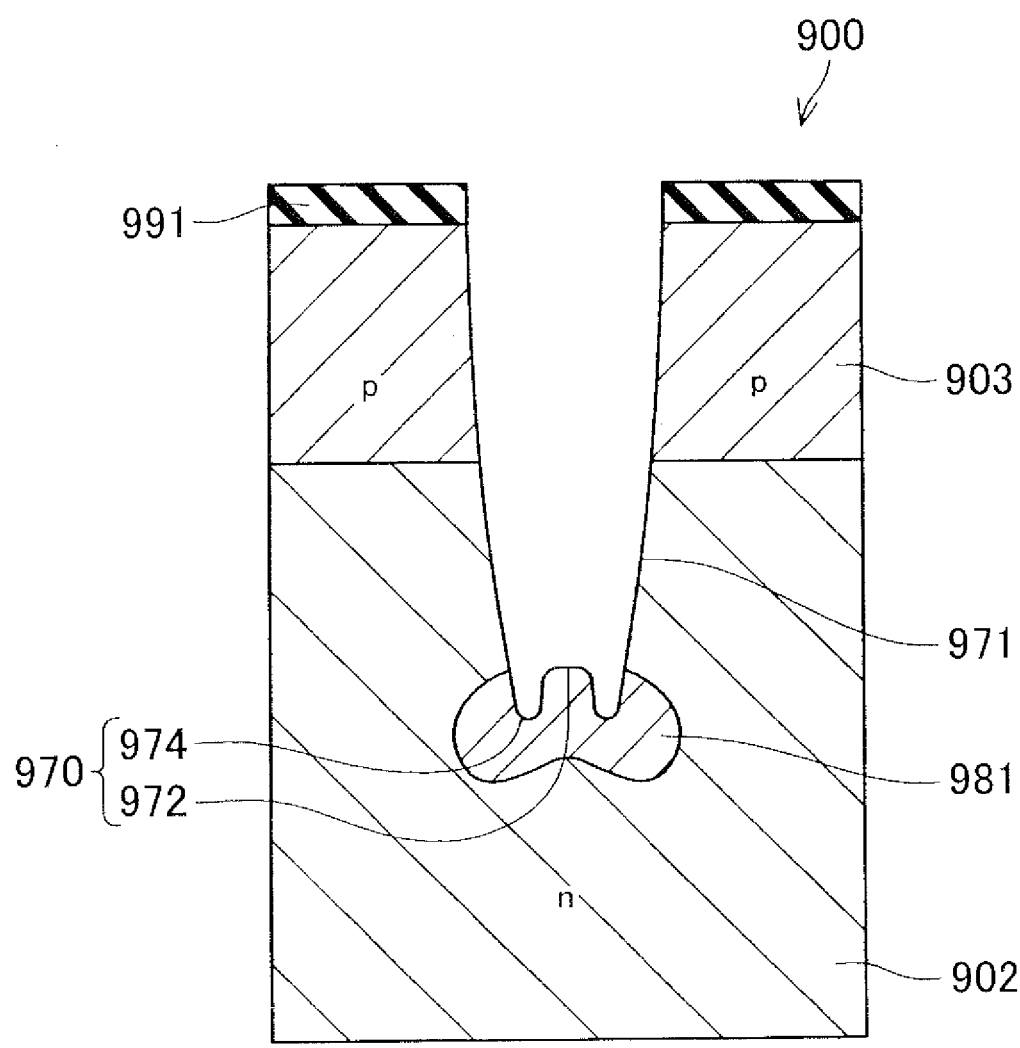
FIG. 5 is a view to describe the manufacturing method of the semiconductor device according to the embodiment of the present invention.
Figure 5:
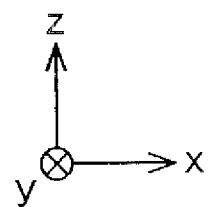

In a second step, in order to form a floating layer 105, p-type impurity ions are inject into the bottom portion of the trench. Initially, as illustrated in FIG. 4, p-type impurity ions are injected into the bottom portion of the trench 971. The injected impurity ions diffuse to a shape of a bottom portion 970, so that a region 981 where the p-type ions diffuse is formed around the end portion 974 and the central portion 972 as illustrated in FIG. 5. Since the p-type ions are diffused around the end portion 974 of the trench 971, the region 981 expands widely in the x direction. As a result, a distance between regions 981 formed in respective bottom portions of adjacent trenches 971 is narrow as compared with conventional devices.

(Third Step)

Figure 6:
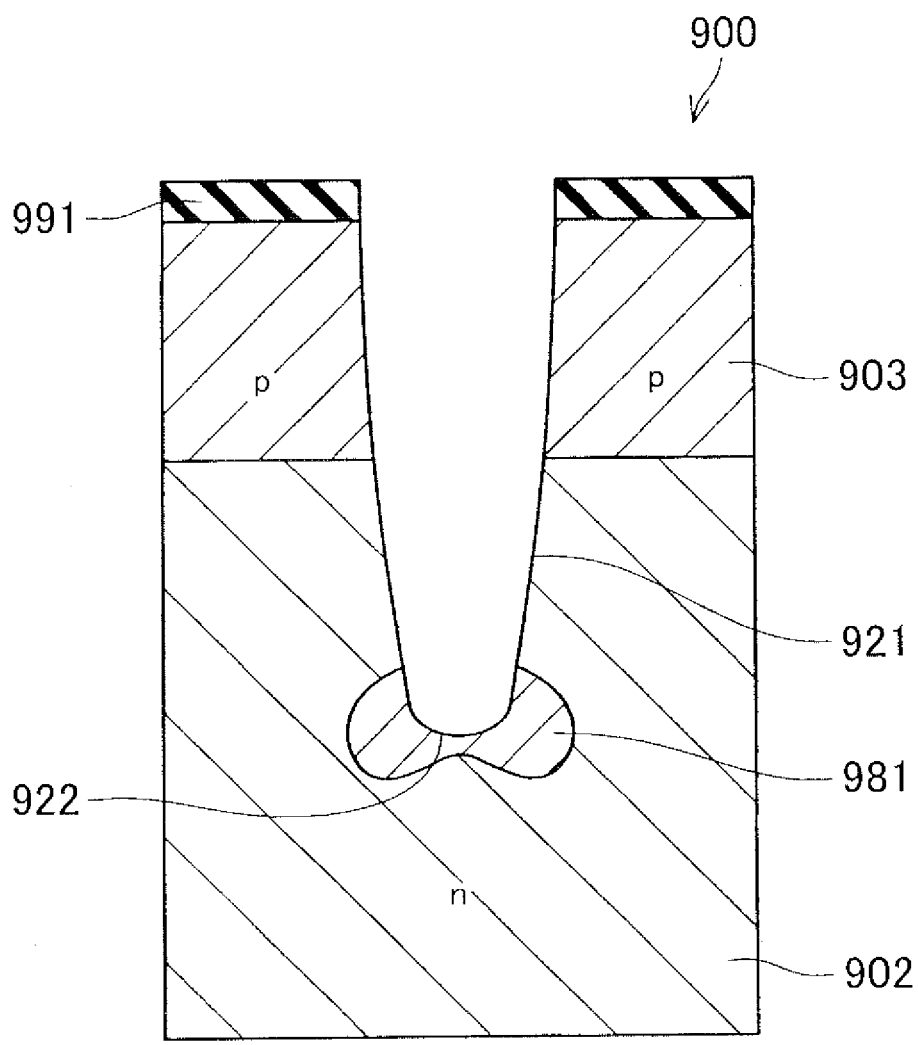
FIG. 6 is a view to describe the manufacturing method of the semiconductor device according to the embodiment of the present invention.
Figure 6:
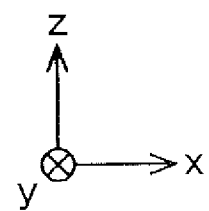

In a third step, the central portion 972 of the trench 971 in the short direction is deepened. Initially, dry etching is performed on the semiconductor wafer 900 illustrated in FIG. 5. Hereby, as illustrated in FIG. 6, the central portion 972 of the trench 971 is selectively etched, so as to form a trench 921 in which a bottom portion 922 is gently deepened from its end towards its center. Gas containing $SF_6$ may be used as process gas. An example of conditions for forming the trench 921 is as follows: mixed gas of $SF_6/O_2=50/50$ is used as the process gas, a gas pressure is set to 30 mTorr to 200 mTorr, and an RF frequency is set to 380 kHz to 13.56 MHz.

(Fourth Step)

Figure 7:
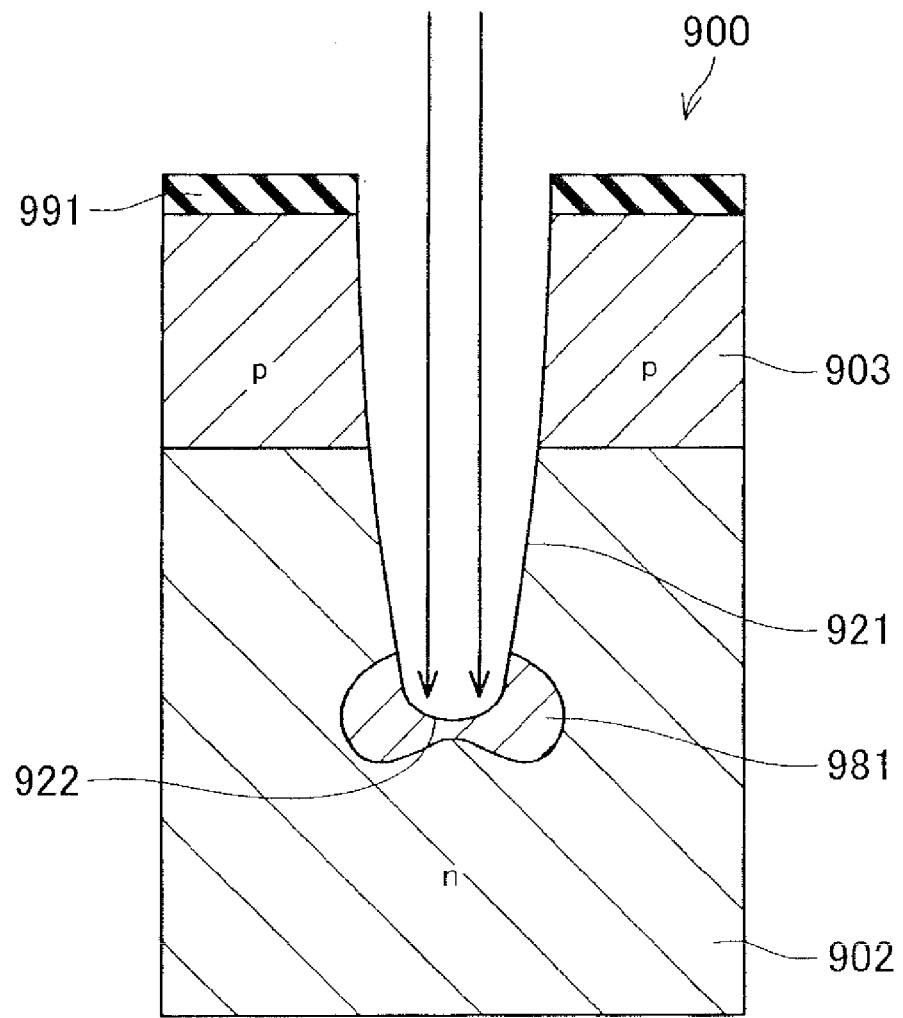
FIG. 7 is a view to describe the manufacturing method of the semiconductor device according to the embodiment of the present invention.
Figure 8:
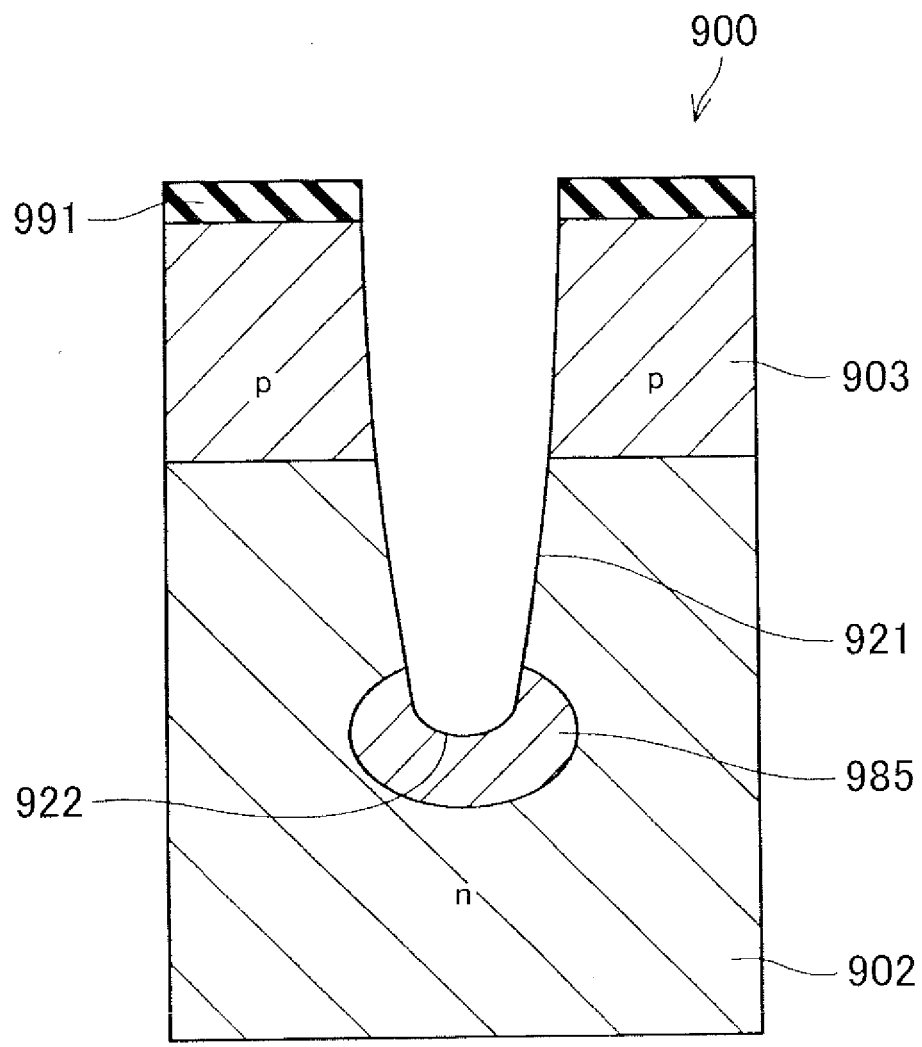
FIG. 8 is a view to describe the manufacturing method of the semiconductor device according to the embodiment of the present invention.

In a fourth step, second conductivity type impurity ions are injected into the bottom portion of the trench 921. Subsequently, p-type impurity ions are injected into the bottom portion of the trench 921, as illustrated in FIG. 7. The impurity ions diffuse to a shape of the bottom portion 922, so that a region 985 where the p-type ions diffuse is formed as illustrated in FIG. 8. The region 985 is gently deepened from an end side of the trench 921 in the x direction toward its central side. Since the bottom portion 922 of the trench 921 is deepest in the vicinity of a central position in the short direction thereof, the bottom portion 922 extends to a deeper position in the semiconductor wafer 900 at the central position of the bottom portion 922 in the short direction. Note that the fourth step is not necessarily required, but when the fourth step is performed, a high withstand-voltage semiconductor device can be manufactured.

Further, n-type impurity ions are injected into the front face and the rear face of the semiconductor wafer 900 illustrated in FIG. 8, so as to form regions to become a source layer 104 and a drain layer 101, and then annealing is performed thereon. Hereby, the region 985 becomes a p-layer serving as the floating layer 105, and the source layer 104 and the drain layer 101 are formed in the semiconductor wafer 900. Further, the gate insulating film 122, the gate electrode 124, the insulating film 135, the rear-face electrode 131, and the front-face electrode 132 are formed by use of a conventionally well-known method. Hereby, the semiconductor device 10 is manufactured. The semiconductor device 10 is configured such that a width of the floating layer 105 in the short direction (the x direction) of the trench gate 120 is sufficiently wide as compared with a semiconductor device manufactured by a conventional manufacturing method. As a result, a distance in the x direction between floating layers 105 provided on respective bottom portions of adjacent trench gates 120 is narrow as compared with the semiconductor device manufactured by the conventional manufacturing method, so that the semiconductor device 10 has an excellent withstand voltage characteristic at the time when the semiconductor device 10 is operated as a MOSFET.

As discussed above, according to the manufacturing method of the present embodiment, the trench 971 having the bottom portion 970 in which the end portion 974 in its short direction is deeper than the central portion 972 is formed in the first step. A step of forming the floating layer 105 includes a step of injecting second conductivity type impurity ions into the bottom portion 970 of the trench 971. In view of this, the impurity ions thus injected expand around the end portion 974, and widely diffuse particularly in a direction perpendicular to an injection direction of the impurity ions. This consequently makes it possible to sufficiently widen the width of the floating layer 105 in the short direction (the x direction) of the trench gate 120, thereby making it possible to manufacture the high withstand-voltage semiconductor device 10. Further, since the width of the floating layer 105 in the x direction is adjustable by use of the shape of the trench 971, it is possible to more surely widen the width of the floating layer 105 in the x direction sufficiently in comparison with the method described in JP 2002-359378 A.

Further, according to the manufacturing method of the present embodiment, it is possible to ensure a depth of the floating layer 105 in vicinity to a center of the trench 921 in the short direction (the x direction) in the fourth step. This makes it possible to further improve the withstand voltage characteristic of the semiconductor device 10.

What is claimed is:

1. A manufacturing method of a semiconductor device, the device including a semiconductor substrate made from silicon carbide and including a first conductivity type drain layer, a first conductivity type drift layer making contact with a front face of the drain layer, a second conductivity type body layer making contact with a front face of the drift layer, a first conductivity type source layer provided in part of a front face of the body layer, and a second conductivity type floating layer surrounded by the drift layer, and a trench gate which includes a gate insulating film formed on an inner wall of a trench and a gate electrode disposed inside the gate insulating film and which has a bottom portion making contact with the floating layer, the floating layer covering the bottom portion of the gate electrode, the manufacturing method comprising:

forming the trench in a semiconductor wafer so as to have a bottom portion in which an end portion in a short direction perpendicular to a longitudinal direction thereof is deeper than a central portion;

forming the floating layer by injecting second conductivity type impurity ions into the bottom portion of the trench after forming the trench; and forming the central portion of the trench in the short direction to be deeper than a depth of the end portion so as not to penetrate the floating layer to the drift layer after forming the floating layer, wherein the central portion of the trench in the short direction is deepened within an area defined by the diffusion of the second conductivity type impurity ions.

2. The manufacturing method of the semiconductor device, according to claim 1, further comprising:

injecting second conductivity type impurity ions into the bottom portion of the trench after forming the central portion of the trench in the short direction to be deeper than the depth of the end portion so as not to penetrate the floating layer to the drift layer after forming the floating layer.

* * * * *